United States Patent
Jigour et al.

(10) Patent No.: US 7,558,900 B2
(45) Date of Patent: Jul. 7, 2009

(54) SERIAL FLASH SEMICONDUCTOR MEMORY

(75) Inventors: Robin J. Jigour, San Jose, CA (US); Eungjoon Park, Fremont, CA (US); Joo Weon Park, Pleasanton, CA (US); Jong Seuk Lee, Palo Alto, CA (US)

(73) Assignee: Winbound Electronics Corporation, Hisn Chu (TW)

( * ) Notice: Subject to any disclaimer, the term of this patent is extended or adjusted under 35 U.S.C. 154(b) by 47 days.

(21) Appl. No.: 11/078,205

(22) Filed: Mar. 11, 2005

(65) Prior Publication Data

US 2006/0067123 A1 Mar. 30, 2006

Related U.S. Application Data

(63) Continuation-in-part of application No. 10/951,187, filed on Sep. 27, 2004, now abandoned.

(51) Int. Cl.
*G06F 13/14* (2006.01)
*G06F 3/00* (2006.01)
*G06F 13/42* (2006.01)

(52) U.S. Cl. .................... 710/305; 710/11; 710/105

(58) Field of Classification Search .............. 710/71, 710/74, 105–106, 305, 11; 711/100–101, 711/103; 257/678, 690, 688–689, 692–693, 257/730

See application file for complete search history.

(56) References Cited

U.S. PATENT DOCUMENTS 5,276,851 A * 1/1994 Thacker et al. .............. 711/120
5,291,584 A 3/1994 Challa et al.
5,652,844 A * 7/1997 Harwood, III ............... 710/104

(Continued)

FOREIGN PATENT DOCUMENTS

EP         1424635 A1 *  6/2004

(Continued)

OTHER PUBLICATIONS

"The I2C-Bus Specification". Version 2.1. Jan. 2000. Philips Semi-conductors. Chapters 2-6. pp. 2-8. Document Order No. 9398 393 40011.*

(Continued)

*Primary Examiner*—Thomas J Cleary
(74) *Attorney, Agent, or Firm*—Cyr & Associates, P.A.

(57) ABSTRACT

A serial flash memory is provided with multiple configurable pins, at least one of which is selectively configurable for use in either single-bit serial data transfers or multiple-bit serial data transfers. In single-bit serial mode, data transfer is bit-by-bit through a pin. In multiple-bit serial mode, a number of sequential bits are transferred at a time through respective pins. The serial flash memory may have 16 or fewer pins, and even 8 or fewer pins, so that low pin count packaging such as the 8-pin or 16-pin SOIC package and the 8-contact MLP/QFN/SON package may be used. The availability of the single-bit serial type protocol enables compatibility with a number of existing systems, while the availability of the multiple-bit serial type protocol enables the serial flash memory to provide data transfer rates, in systems that can support them, that are significantly faster than available with standard serial flash memories.

29 Claims, 12 Drawing Sheets

| EXAMPLE A: 1 OR 4 BIT SERIAL | | | | |
|---|---|---|---|---|
| PIN | TYPE | ESPI MODE | SPI MODE | I2C MODE |
| 1 | /CS | /CS | /CS | X |
| 2 | CP | IO | DO | IO |
| 3 | CP | IO | /WP | X |
| 4 | GND | GND | GND | GND |
| 5 | CP | IO | DI | X |
| 6 | CLK | CLK | CLK | CLK |
| 7 | CP | IO | /HOLD | X |
| 8 | VCC | VCC | VCC | VCC |

| EXAMPLE B: 1 OR 2 BIT SERIAL | | | | |
|---|---|---|---|---|
| PIN | TYPE | ESPI MODE | SPI MODE | I2C MODE |
| 1 | /CS | /CS | /CS | X |
| 2 | CP | IO | DO | IO |
| 3 | /WP | /WP | /WP | X |
| 4 | GND | GND | GND | GND |
| 5 | CP | IO | DI | X |
| 6 | CLK | CLK | CLK | CLK |
| 7 | /HOLD | /HOLD | /HOLD | X |
| 8 | VCC | VCC | VCC | VCC |

U.S. PATENT DOCUMENTS

| | | | |
|---|---|---|---|
| 5,815,426 A | | 9/1998 | Jigour et al. |
| 5,877,975 A | | 3/1999 | Jigour et al. |
| 5,966,723 A | * | 10/1999 | James et al. ............... 711/103 |
| 6,026,007 A | | 2/2000 | Jigour et al. |
| 6,175,517 B1 | | 1/2001 | Jigour et al. |
| 6,892,269 B2 | * | 5/2005 | Polizzi et al. ............... 711/103 |
| 6,914,908 B1 | * | 7/2005 | Harrand et al. ............. 370/439 |
| 2003/0065863 A1 | * | 4/2003 | Wyland ...................... 710/305 |
| 2003/0090939 A1 | * | 5/2003 | Perroni et al. .......... 365/185.09 |
| 2003/0101296 A1 | * | 5/2003 | Kuzmenka .................. 710/104 |
| 2004/0201684 A1 | * | 10/2004 | Janson, Jr. ............... 348/207.1 |
| 2005/0013153 A1 | * | 1/2005 | Perroni et al. ............... 365/100 |
| 2005/0030801 A1 | * | 2/2005 | Perroni et al. ............... 365/200 |
| 2008/0005434 A1 | * | 1/2008 | Lee et al. ................... 710/110 |

FOREIGN PATENT DOCUMENTS

| | | | |
|---|---|---|---|
| EP | 1480224 A1 | * | 11/2004 |
| JP | 2001092771 A | * | 4/2001 |

OTHER PUBLICATIONS

'parallel' in "Microsoft Press Computer Dictionary". Second Edition. 1994. Microsoft Press. p. 290.*

'serial' in "Microsoft Press Computer Dictionary". Second Edition. 1994. Microsoft Press. p. 354.*

"spiflash W25X20, W25X40, And W25X80 2M-BIT, 4M-BIT and 8M-BIT Serial Flash Memory with 4KB Sectors and Dual Output SPI". Advance Information Document. Jun. 28, 2005. Winbond Electronics Corp. pp. 1-32.*

"About Winbond". Webpage. Winbond Electronics Corporation America. Retrieved from Internet May 5, 2008. <http://www.winbond-usa.com/en/content/view/88/347>.*

"Winbond". Wikipedia, the free encyclopedia. Online Mar. 5, 2008. Retrieved from Internet May 5, 2008. <http://en.wikipedia.org/wiki/Winbond>.*

Atmel®, DataFlash®, Application Note (AN-4), "Using Atmel's DataFlash®", Rev. 0842D-DFLSH-Nov. 2002 (30 pages).

Atmel®, 64-megabit 2.7-volt Only Dual-interface DataFlash®, AT45DB642, Rev. 1638F-DFLSH-Sep. 2002 (37 pages).

NexFlash Technologies, Inc. Product Brief, spiflash™ 1M / 2M / 4M-Bit Serial Flash Memory NX25P10, NX25P20 and NX25P40, (Dec. 2003), (2 pages).

NexFlash Technologies, Inc. Product Brief, spiflash™ 8M, 16M and 32M-Bit Serial Flash Memory NX25P80, NX25P16 and NX25P32, (Jul. 2004), (2 pages).

U.S. Appl. No. 10/951,187 for Robin J. Jigour, et al. entitled "Serial Flash Semiconductor Memory", filed Sep. 27, 2004.

* cited by examiner

| EXAMPLE A: 1 OR 4 BIT SERIAL ||||
| PIN | TYPE | ESPI MODE | SPI MODE | I2C MODE |
| --- | --- | --- | --- | --- |
| 1 | /CS | /CS | /CS | X |
| 2 | CP | IO | DO | IO |
| 3 | CP | IO | /WP | X |
| 4 | GND | GND | GND | GND |
| 5 | CP | IO | DI | X |
| 6 | CLK | CLK | CLK | CLK |
| 7 | CP | IO | /HOLD | X |
| 8 | VCC | VCC | VCC | VCC |

| EXAMPLE B: 1 OR 2 BIT SERIAL ||||
| PIN | TYPE | ESPI MODE | SPI MODE | I2C MODE |
| --- | --- | --- | --- | --- |
| 1 | /CS | /CS | /CS | X |
| 2 | CP | IO | DO | IO |
| 3 | /WP | /WP | /WP | X |
| 4 | GND | GND | GND | GND |
| 5 | CP | IO | DI | X |
| 6 | CLK | CLK | CLK | CLK |
| 7 | /HOLD | /HOLD | /HOLD | X |
| 8 | VCC | VCC | VCC | VCC |

| EXAMPLE A: 1 OR 4 BIT SERIAL ||||
| PIN | DATA TYPE | ESPI MODE | SPI MODE | I2C MODE |
| --- | --- | --- | --- | --- |
| 1 | IO | ↔ | → | ↔ |
| 2 | IO | ↔ | ← | |
| 3 | IO | ↔ | | |
| 4 | IO | ↔ | | |

| EXAMPLE B: 1 OR 3 BIT SERIAL, DEDICATED DO ||||
| PIN | DATA TYPE | ESPI MODE | SPI MODE | I2C MODE |
| --- | --- | --- | --- | --- |
| 1 | DO | → | → | |
| 2 | IO | ← | ← | ↔ |
| 3 | IO | ↔ | | |
| 4 | IO | ↔ | | |

| EXAMPLE C: 1 OR 3 BIT SERIAL, DEDICATED DI ||||
| PIN | DATA TYPE | ESPI MODE | SPI MODE | I2C MODE |
| --- | --- | --- | --- | --- |
| 1 | IO | → | → | ↔ |
| 2 | DI | ← | ← | |
| 3 | IO | ↔ | | |
| 4 | IO | ↔ | | |

| EXAMPLE D: 1 OR 3 BIT SERIAL, DEDICATED DO AND DI ||||
| PIN | DATA TYPE | ESPI MODE | SPI MODE | I2C MODE |
| --- | --- | --- | --- | --- |
| 1 | DO | → | → | |
| 2 | DI | ← | ← | |
| 3 | IO | ↔ | | ↔ |
| 4 | IO | ↔ | | |

FIG. 8

| S7 | S6 | S5 | S4 | S3 | S2 | S1 | S0 |
|---|---|---|---|---|---|---|---|
| SRP | Q1 | Q0 | BP2 | BP1 | BP0 | WEL | BUSY |

FIG. 10

| CLK 1 | CLK 2 | CLK 3 | CLK 4 | CLK 5 | CLK 6 | CLK 7 | CLK 8 | CLK 9 | CLK 10 |
|---|---|---|---|---|---|---|---|---|---|
| 0h | 3h | A23-20 | A19-16 | A15-12 | A11-8 | A7-4 | A3-0 | Dummy | Dummy |

| CLK 11 | CLK 12 | CLK 13 | CLK 14 | CLK 15 | CLK 16 | CLK x | CLK x |
|---|---|---|---|---|---|---|---|
| Dummy | Dummy | Dummy | Dummy | Dummy | Dummy | D7-4 | D3-0 |

FIG. 11

| CLK 1 | CLK 2 | CLK 3 | CLK 4 | CLK 5 | CLK 6 | CLK 7 | CLK 8 | CLK x | CLK x |
|---|---|---|---|---|---|---|---|---|---|
| 1h | 3h | A23-20 | A19-16 | Dummy | Dummy | Dummy | Dummy | D7-4 | D3-0 |

FIG. 12

| CLK 1 | CLK 2 | CLK 3 | CLK 4 | CLK 5 | CLK 6 | CLK 7 | CLK 8 | CLK x | CLK x |
|---|---|---|---|---|---|---|---|---|---|
| 2h | 3h | A15-12 | A11-8 | Dummy | Dummy | Dummy | Dummy | D7-4 | D3-0 |

FIG. 13

| PIN | TYPE | SPI (INPUT/OUTPUT) | ESPI (OUTPUT) |
|---|---|---|---|
| 1 | /CS | /CS | /CS |
| 2 | CP | DO | DO-ODD |
| 3 | /WP | /WP | /WP |
| 4 | GND | GND | GND |
| 5 | CP | DI | DO-EVEN |
| 6 | CLK | CLK | CLK |
| 7 | /HOLD | /HOLD | /HOLD |
| 8 | VCC | VCC | VCC |

FIG. 16

| Instruction Name | Byte 1 (Code) | Byte 2 | Byte 3 | Byte 4 | Byte 5 | Byte 6 | n-Bytes |
|---|---|---|---|---|---|---|---|
| Write Enable | 06h | | | | | | |
| Write Disable | 04h | | | | | | |
| Read Status Register | 05h | (S7–S0)[1] | | | | | [2] |
| Write Status Register | 01h | S7–S0 | | | | | |
| Read Data | 03h | A23–A16 | A15–A8 | A7–A0 | (D7–D0) | (Next byte) | continuous |
| Fast Read | 0Bh | A23–A16 | A15–A8 | A7–A0 | dummy | (D7–D0) | (Next Byte) continuous |
| Fast Read Dual Output | 3Bh | A23–A16 | A15–A8 | A7–A0 | dummy | I/O = (D6,D4,D2,D0) O = (D7,D5,D3,D1) | (one byte per 4 clocks, continuous) |
| Page Program | 02h | A23–A16 | A15–A8 | A7–A0 | (D7–D0) | (Next byte) | Up to 256 Bytes |
| Block Erase (64KB) | D8h | A23–A16 | A15–A8 | A7–A0 | | | |
| Sector Erase (4KB) | 20h | A23–A16 | A15–A8 | A7–A0 | | | |
| Chip Erase | C7h | | | | | | |
| Power-down | B9h | | | | | | |
| Release Power-down and Device ID | ABh | dummy | dummy | dummy | (ID7–ID0)[4] | | |
| Manufacturer/Device ID[3] | 90h | dummy | dummy | 00h | (M7–M0) | (ID7–ID0) | |
| JEDEC ID | 9Fh | (M7–M0) Manufacturer | (ID15–ID8) Memory Type | (ID7–ID0) Capacity | | | |

FIG. 17

SERIAL FLASH SEMICONDUCTOR MEMORY

CROSS-REFERENCE TO RELATED APPLICATIONS

This patent is a continuation-in-part of and claims the benefit of U.S. patent application Ser. No. 10/951,187 filed Sep. 27, 2004 now abandoned (Jigour et al., "Serial flash semiconductor memory"), which hereby is incorporated herein in its entirety by reference thereto.

STATEMENT REGARDING FEDERALLY SPONSORED RESEARCH OR DEVELOPMENT

Not Applicable

BACKGROUND OF THE INVENTION

1. Field of the Invention

The present invention relates to flash semiconductor memory, and more particularly to serial flash semiconductor memory.

2. Description of the Related Art

Electronic systems have traditionally used parallel "NOR" flash memories for non-volatile code storage, and in some cases data storage. Newer serial flash memories, with their low pin-count and small packaging, are an alternative to ordinary parallel flash memories for code and data storage requirements. As a result, the use of serial flash memory is gaining momentum. Diverse applications such as graphics cards, hard drives, printers, wireless networking, set-top boxes, DVD drives and players, DSL modems, field programmable gate arrays, and other applications are turning to serial flash memory to reduce controller pin count, board space, power consumption, noise, and overall system costs.

A significant difference between serial flash memory and parallel flash memory has to do with interface pins and packaging. Serial flash memory typically have data, control and power pins, but no dedicated address pins. Most serial flash memories use the popular four-pin Serial Peripheral Interface ("SPI") protocol, and are typically housed in low pin count packages such as the 8-pin or 16-pin Small Outline Integrated Circuit ("SOIC") package and the 8-contact Micro Leadframe Package ("MLP") (also referred to as Quad Flat No-lead ("QFN") and Small Outline No-lead ("SON"). An 8-pin SOIC or MLP package uses less than 25 percent the space of a parallel flash package. In contrast, parallel flash memories typically require 22 to 44 address, data and control pins, and are commonly packaged in 32-pin Plastic Leaded Chip Carrier ("PLCC") and 40 to 56-pin Thin Small Outline Package ("TSOP") packages. Relative space requirements are evident from FIG. 1, which shows a parallel flash package 12 adjacent a serial flash package 14. A standard paperclip 10 is shown for scale. Relative pin-out and space requirements are evident from FIG. 2, which shows a pinout diagram for parallel flash package 20 and serial flash package 22. Serial Flash densities typically range from 512 K-bit to 128 M-bit, although advanced 0.18 micron technologies can fit higher densities of 4 M-bit and greater into small 8-pin packaging. Examples of typical serial flash memories are disclosed in the data sheets for part numbers NX25P10/20/40 and NX25P80/16/32, which are available from NexFlash Technologies Inc. of San Jose, Calif.

The SPI protocol specifies a four wire interface, namely clock (CLK), chip select (/CS), data in (DI) and data out (DO). Power is provided through the $V_{CC}$ and GND pins. Optional write-protect /WP and hold /HOLD pins are commonly provided. The write-protect pin is used for additional hardware protection of the memory. The hold pin allows the device to be suspended during an instruction, which can be useful if multiple devices are sharing the same SPI bus. These pins can simply be tied high if not used. These pins are shown in FIG. 2.

A variety of other serial specifications have been proposed, including MICROWIRE, I2C (Inter IC bus), and NXS. The MICROWIRE specification is a two data pin DI and DO interface similar to the SPI specification. The I2C and NXS protocols specify a bit serial data IO pin. The SPI and NXS protocols are described in the following patents, which are hereby incorporated herein by reference in their entirety: U.S. Pat. No. 6,175,517, issued Jan. 16, 2001 to Jigour et al. and entitled "Insertable and removable digital memory apparatus," U.S. Pat. No. 6,026,007, issued Feb. 15, 2000 to Jigour et al. and entitled "Insertable and removable high capacity digital memory apparatus and methods of operation thereof," U.S. Pat. No. 5,877,975, issued Mar. 2, 1999 to Jigour et al. and entitled "Insertable/removable digital memory apparatus and methods of operation thereof," U.S. Pat. No. 5,815,426, issued Sep. 29, 1998 to Jigour et al. and entitled "Adapter for interfacing an insertable/removable digital memory apparatus to a host data port," and U.S. Pat. No. 5,291,584, issued Mar. 1, 1994 to Challa et al. and entitled "Method and Apparatus for Hard Disk Emulation." While the use of eight contact pads is common for these protocols, fewer contact pads would be entirely satisfactory for some applications and the interface protocols would be adjusted accordingly.

FIG. 3 is a set of graphs showing a clocking diagram of a read instruction that is common among serial flash memories. After chip select is asserted low as shown at 30, a single read instruction byte (03hex) is clocked into the device as shown at 32, followed by a 24-bit address as shown at 34. Data may be continuously clocked out of the serial flash memory from the starting address as shown at 36, until chip select is raised (not shown).

Due to historical reasons, the architectures of standard processors or microcontrollers boot and execute code from a parallel interface. However, many system-on-a-chip ASIC controllers are moving away from the old parallel flash interface and are now using serial flash for code storage. Serial code storage, also referred to as code shadowing, is a design technique that initially appeared with complex graphics and hard drive controllers, and has now expanded to a broad range of high performance applications. These controller-based systems were often downloading code upon power-up from parallel flash memory to faster RAM, a function that Serial Flash can handle more efficiently and cost effectively, as will be appreciated from a comparison of FIG. 4 and FIG. 5.

FIG. 4 shows an application specific controller 48 with a high-speed RAM (RAM, DRAM or SDRAM) interface 49 and a parallel flash memory 40. Due to interface compatibility and performance issues, the parallel flash memory is often separate from the RAM interface, and requires 17 to 22 address lines 44, an 8-bit or 16-bit data bus 46, and three to six control lines 42. This is a considerable overhead for most application specific controllers.

FIG. 5 shows an application specific controller 54 using a serial flash memory with a four-pin SPI interface 52 for serial code storage. In this arrangement, the controller 54 upon power-up boots either from internal ROM (not shown) or from code that has been transferred from the serial flash 50 to either internal RAM 56 or external RAM 58 using a single read command. Typically all or a significant part of the code in the flash memory 50 is transferred to the RAM 56 or RAM 58 and is executed from the RAM 56 or RAM 58, as appropriate. Code segments can also be transferred dynamically to the RAM 56 or RAM 58 as needed after power-up.

Systems that use serial flash memory realize significant benefits. Removing the parallel flash interface frees controller pins for other purposes, or may enable the controller to fit into a smaller and lower-cost package. The tiny and low-pin-count serial flash packaging allows the printed circuit board to be smaller with fewer traces, further reducing costs. Transient switching noise, common with parallel address and data busses, is eliminated. Additionally, serial flash tends to consume less power during read than parallel flash. Moreover, once the code is downloaded, serial flash can be placed into low power (microamp) stand-by to further minimize supply requirements. In those cases where parallel flash was originally used for code execution, switching to serial code storage with execution out of RAM also increases performance. Additionally, code can be compressed in the serial flash and decompressed when downloaded for greater storage capacity.

Besides the user benefits of serial flash, there are manufacturer benefits as well. Serial flash packages are smaller and use fewer pins so they cost less than parallel flash packages, especially for popular 8-pin SOIC packages. With fewer pins, there are fewer I/O pads on the die, resulting in smaller die sizes and lower die costs. Additionally, fewer pins mean many more devices can be tested simultaneously. Since flash memory test costs represent a significant portion of the overall product cost, serial flash provides a more cost effective solution.

Despite significant advantages of serial flash over parallel flash, parallel flash memories retain some advantages over serial flash memories. One of these is faster transfer speed. Since a system cannot operate until its code is downloaded, fast serial flash clock speed is desirable. Most serial flash memories today support clock frequencies in the range of 20 MHz, and some devices support SPI read clock speeds from 33 MHz to 50 MHz. At these clock rates, it can take from 20 milliseconds to 52 milliseconds to transfer 1 M-bit of code. While this may be acceptable for lower density serial flash of less than 4 M-bit, for example, the power-up delay can increase as density requirements increase. For example, transferring 64 M-bits of code at 50 MHz takes over 1.3 seconds. In contrast, a parallel flash memory with a 16-bit data bus and 70 nS access time can transfer the same amount of code three to four times faster.

For systems that do not operate from internal or external RAM, another advantage of parallel flash memory over serial flash memory is code execution. The architecture of many parallel flash memories provides 3-6 control pins, 17-22 address pins, and an 8 or 16-bit data pins that interface with standard processors or microcontrollers. Micro-code can be executed directly from the parallel flash memory using small amounts of locally dedicated memory or registers, with random memory access for jumps and calls, as well as fast data transfers using direct memory access (DMA) techniques being supported.

Code execution on a serial flash memory is not practical because of the amount of overhead required. Basically in a serial flash memory system, the controller would serially shift each read instruction with a memory address one bit at a time, requiring typically, for example, 32 clocks. A memory read of parallel flash, in contrast, can be made in one or a few clocks because the address and data are transferred in parallel. The overhead of a serial flash is further increased when the instruction sequence encounters frequent address jumps or calls, each of which would require another serial read instruction to be shifted in bit-by-bit. Even at the fastest serial flash clock rates, such a system would be significantly slower than a parallel flash memory.

Some flash memories have attempted to incorporate both serial and parallel buses in their design. The type AT45DB642 flash memory available from Atmel Corporation of San Jose, Calif., for example, has added an 8-bit parallel data bus as a user-selectable alternative to the standard SPI bus; see Atmel Corporation, AT45DB642 Data Sheet, 2002. However, the clock frequency is reduced by 75% when using the parallel interface, substantially limiting the net gain in transfer rate. Additionally the device has 20 signal and power pins and in housed in a 40-pin TSOP, which is contrary to the most fundamental Serial Flash advantages of lower pin count and smaller packaging.

Since existing flash memory systems of the serial and parallel type have significant disadvantages, there is need for a device that can support existing interfaces yet allow for increased performance and features as needed in the application.

BRIEF SUMMARY OF THE INVENTION

The present invention advantageously offers the low pin-count and space-efficient packaging of conventional serial flash memory with faster transfer rates and code execution capability which in some embodiments approaches that of parallel flash, even while supporting conventional serial flash interfaces. These enhanced capabilities allow for increased performance and features as needed in the application.

One embodiment of the present invention is a flash memory comprising a flash memory array and an interface circuit coupled to the flash memory array. The interface circuit has a plurality of pins and is selectively compliant with a single-bit serial protocol and a multiple-bit serial protocol. A first one of the pins is configurable for single-bit serial transfer in compliance with the single-bit serial protocol. The first pin and a second one of the pins are configurable for multiple-bit serial transfer in compliance with the multiple-bit serial protocol.

Another embodiment of the present invention is a flash memory comprising a flash memory array and an interface circuit coupled to the flash memory array. The interface circuit has a clock pin, a chip select pin, and first, second, third and fourth pins, and is selectively compliant with Serial Peripheral Interface protocol and a four-bit serial protocol. The first pin is configurable as a data output pin and the second pin is configurable as a data input pin for single-bit serial transfer in compliance with the Serial Peripheral Interface protocol. The first, second, third and fourth pins are further configurable as input/output pins for four-bit serial transfers in compliance with the four-bit serial protocol.

Another embodiment of the present invention is a flash memory comprising a flash memory array and an interface circuit coupled to the flash memory array. The interface circuit has a plurality of pins and is selectively compliant with a single-bit serial protocol and a multiple-bit serial protocol. A first one of the pins is selectively configurable as a data input in compliance with the single bit serial protocol and as a data input/output in compliance with the multiple bit serial protocol. A second one of the pins is selectively configurable as a data output in compliance with the single bit serial protocol and as a data input/output in compliance with the multiple bit serial protocol.

Another embodiment of the present invention is a flash memory comprising a flash memory array and an interface circuit coupled to the flash memory array. The interface circuit comprising a plurality of pins and is selectively compliant with a single-bit serial protocol and a multiple-bit serial protocol. A first one of the pins is selectively configurable as a data input in compliance with the single bit serial protocol and as a data input in compliance with the multiple bit serial protocol. A second one of the pins is selectively configurable as a data output in compliance with the single bit serial protocol and as a data output in compliance with the multiple bit serial protocol. A third one of the pins is a data input/output in compliance with the multiple bit serial protocol.

Another embodiment of the present invention is a flash memory comprising a flash memory array and an interface circuit coupled to the flash memory array. The interface circuit comprising a plurality of pins and is selectively compliant with a single-bit serial protocol and a multiple-bit serial protocol. A first one of the pins is selectively configurable as a data input/output in compliance with the single bit serial protocol and as a data input/output in compliance with the multiple bit serial protocol. A second one of the pins is a data input/output in compliance with the multiple bit serial protocol.

Another embodiment of the present invention is a flash memory comprising a flash memory array and an interface circuit coupled to the flash memory array. The interface circuit has a plurality of pins and is selectively compliant with a single-bit serial protocol and a multiple-bit serial protocol. A first one of the pins is configurable for single-bit serial data input in compliance with the single-bit serial protocol. A second one of the pins is configurable for single-bit serial data output in compliance with the single-bit serial protocol. Both the first pin and the second pin are configurable for multiple-bit serial output in compliance with the multiple-bit serial protocol.

Yet another embodiment of the present invention is a packaged flash memory device comprising an eight-contact SOIC or MLP package body; a flash memory array contained in the package body; an interface circuit contained in the package body and coupled to the flash memory array, the interface circuit being selectively compliant with a Serial Peripheral Interface protocol and an Enhanced Serial Peripheral Interface protocol; and four or fewer data contacts, a clock contact, and a chip select contact mounted on the package body and coupled to the interface circuit. A first one of the data contacts is selectively configurable as a data input in compliance with the Serial Peripheral Interface protocol and as a data input/output in compliance with the Enhanced Serial Peripheral Interface protocol, and a second one of the data contacts is selectively configurable as a data output in compliance with the Serial Peripheral Interface protocol and as a data input/output in compliance with the Enhanced Serial Peripheral Interface protocol.

Yet another embodiment of the present invention is a packaged flash memory device operable under either a single-bit serial protocol or a multiple-bit serial protocol, comprising an eight-contact SOIC or MLP package body; first and second data contacts, a clock contact, and a chip select contact mounted on the package body; a flash memory array contained in the package body; and an interface circuit contained in the package body and coupled to the flash memory array and to the first and second data contacts, a clock contact, and a chip select contact. The interface circuit is operable under a single-bit serial protocol to establish the first data contact as a data input and the second data contact as a data output, and is operable under a multiple-bit serial protocol to establish the first and second data contacts as data input/output.

A further embodiment of the present invention is a packaged flash memory device operable under either a single-bit serial protocol or a multiple-bit serial protocol, comprising an SOIC or MLP package body; a flash memory array contained in the package body; an interface circuit contained in the package body and coupled to the flash memory; a clock contact coupled to the interface circuit; a chip select contact coupled to the interface circuit; and first and second data contacts coupled to the interface circuit. The interface circuit is operable under a single-bit serial protocol to establish the first data contact as a data input and the second data contact as a data output, and is operable under a multiple-bit serial protocol to establish the first and second data contacts as data outputs.

Another embodiment of the present invention is a method for initializing a flash memory coupled to a controller, the flash memory being selectively compliant with a single-bit serial protocol and a multiple-bit serial protocol. The method comprises operating the flash memory under the single-bit serial protocol; detecting compliance of the flash memory with the multiple-bit serial protocol; and switching the flash memory to operation under the multiple-bit serial protocol, in response to the detecting step.

Yet another embodiment of the present invention is a method for executing code from a flash memory, comprising obtaining a multiple bit segment of an instruction from the flash memory; processing the multiple bit instruction segment in a controller to initiate decode of the instruction; obtaining an additional multiple bit segment of the instruction from the flash memory; processing the additional multiple bit instruction segment in the controller to continue decode of the instruction; repeating the additional multiple bit instruction segment obtaining step and the additional multiple bit instruction segment processing step until the instruction is fully decoded; and executing the decoded instruction.

A further embodiment of the present invention is a method for executing code from a flash memory, comprising obtaining a multiple bit segment of an instruction from the flash memory; storing the multiple bit instruction segment in a controller; obtaining an additional multiple bit segment of the instruction from the flash memory; storing the additional multiple bit instruction segment in the controller; repeating the additional multiple bit instruction segment obtaining step and the additional multiple bit instruction segment storing step until the instruction is fully assembled; and decoding the instruction promptly upon full assembly thereof.

BRIEF DESCRIPTION OF THE SEVERAL VIEWS OF THE DRAWINGS

FIG. 8 is a table showing four exemplary data pin assignments, one being for a 1 or 4 bit serial flash memory device, and three being for 1 or 3 bit serial flash memory devices.

FIG. 10 is a schematic representation of a status register.

FIG. 11 is a schematic representation of an Enhanced SPI Read instruction.

FIG. 12 is a schematic representation of a Read Block instruction.

FIG. 13 is a schematic representation of a Read Page in Current Block instruction.

FIG. 16 is a table showing an illustrative pin assignment suitable for the flash memory device of FIG. 14.

FIG. 17 is a table showing an illustrative set of instructions suitable for the flash memory devices of FIG. 14 and FIG. 15.

DETAILED DESCRIPTION OF THE INVENTION, INCLUDING THE BEST MODE

A serial flash memory is provided with multiple configurable pins ("CP"), at least one of which is selectively configurable for use in either single-bit serial data transfers or multiple-bit serial data transfers. The term "pin" is used herein to refer to an interface element on the serial flash memory used for external connection, whether it be a contact on a die such as a bonding pad, a contact mounted on a package including recessed contacts, flush contacts, and projecting contacts, and so forth. In single-bit serial mode, data transfer is bit-by-bit through a pin. In multiple-bit serial mode, a number of sequential bits are transferred at a time through respective pins. For the multiple-bit serial data transfer, preferably a number of data pins equal to a power of two are used, such as two or four or more, although an odd number may be used if desired. Preferably the serial flash memory has 16 or fewer pins, and even more preferably 8 or fewer pins, so that low pin count packaging such as the 8-pin or 16-pin SOIC package and the 8-contact MLP/QFN/SON package may be used. Advantageously, the availability of the single-bit serial type protocol enables compatibility with a number of existing systems, particularly in those wishing to incorporate low pin-count and space-efficient packaged memory, while the availability of the multiple-bit serial type protocol enables the serial flash memory to provide data transfer rates, in systems that can support them, that are significantly faster than available with standard serial flash memories. The faster transfer rates and other features enable improvements in system boot-up time (code download upon power-up), and also enable systems to execute code directly from the serial flash memory.

Figure 1:
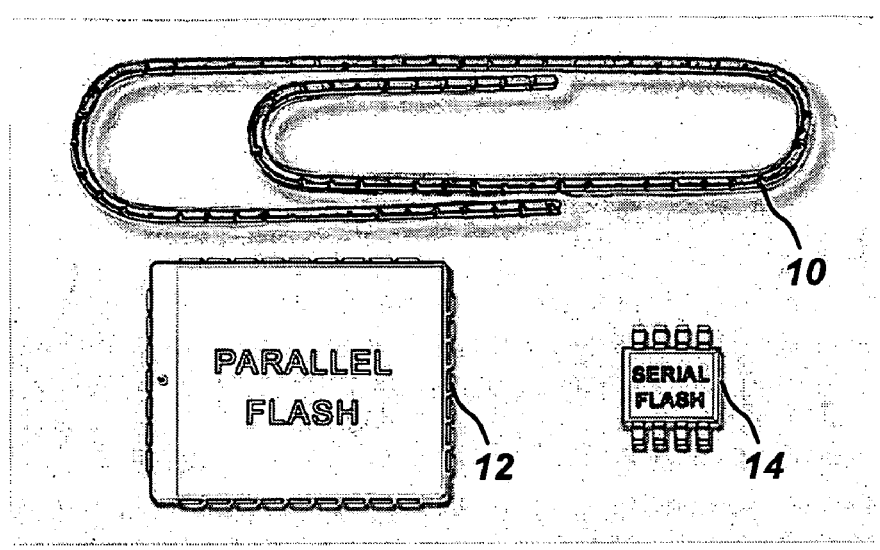
FIG. 1 is a plan diagram of various prior art flash memory packages.
Figure 2:
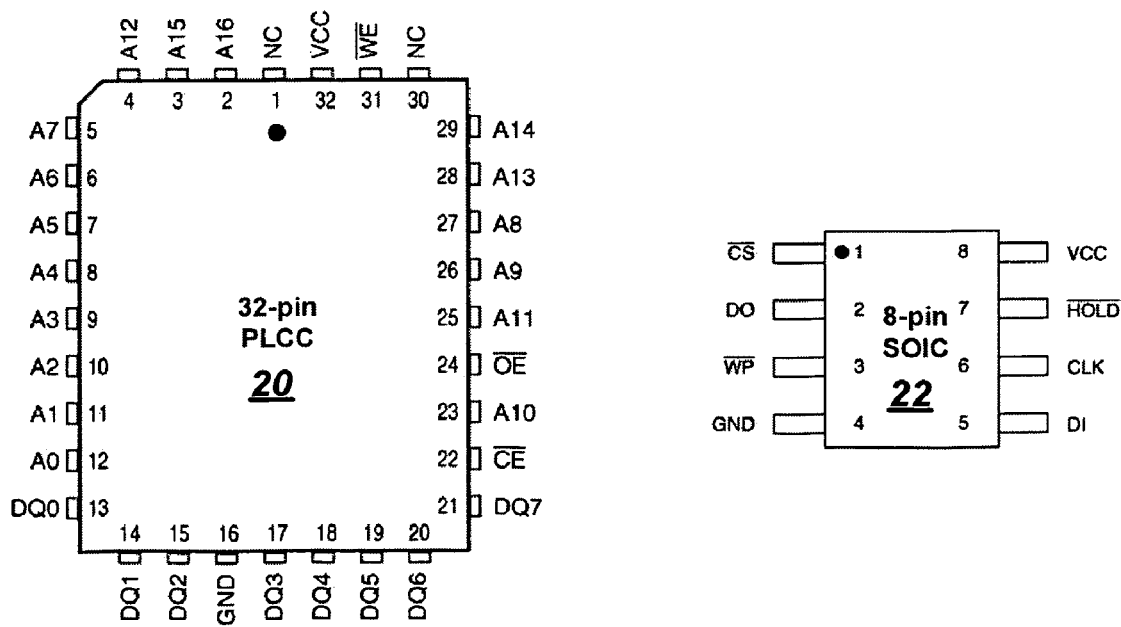
FIG. 2 is a schematic pictorial diagram of various prior art flash memory packages.
Figure 3:
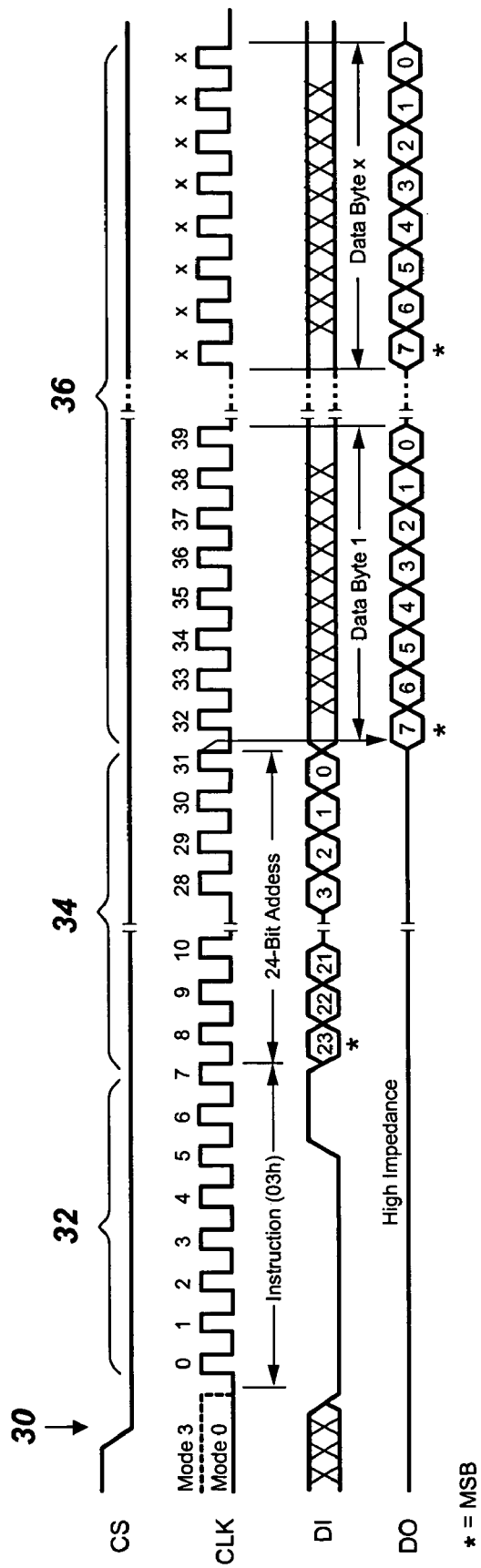
FIG. 3 is a clocking diagram of a prior art read instruction for serial flash memory.
Figure 4:
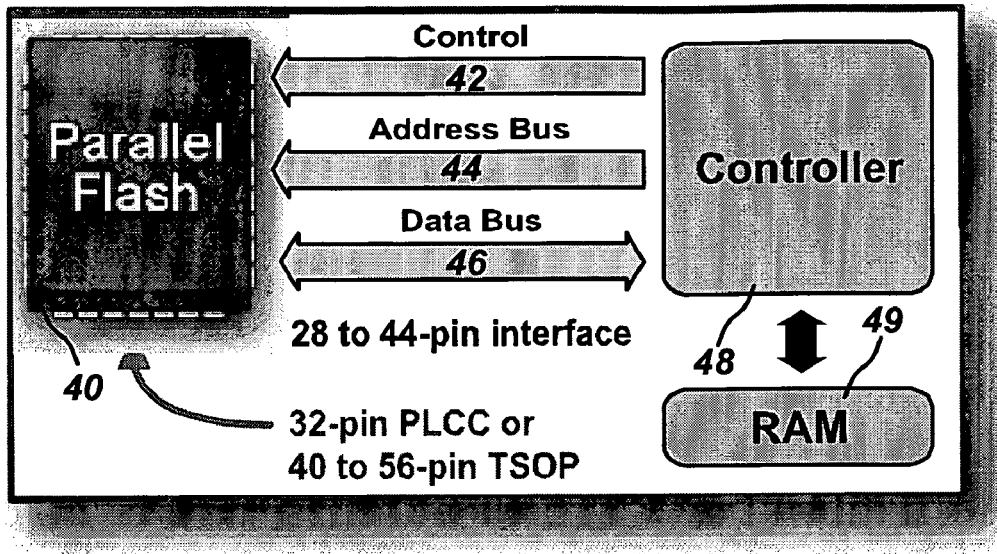
FIG. 4 is a schematic block diagram of a prior art arrangement of an application specific controller using a high-speed RAM interface and a parallel flash memory.
Figure 5:
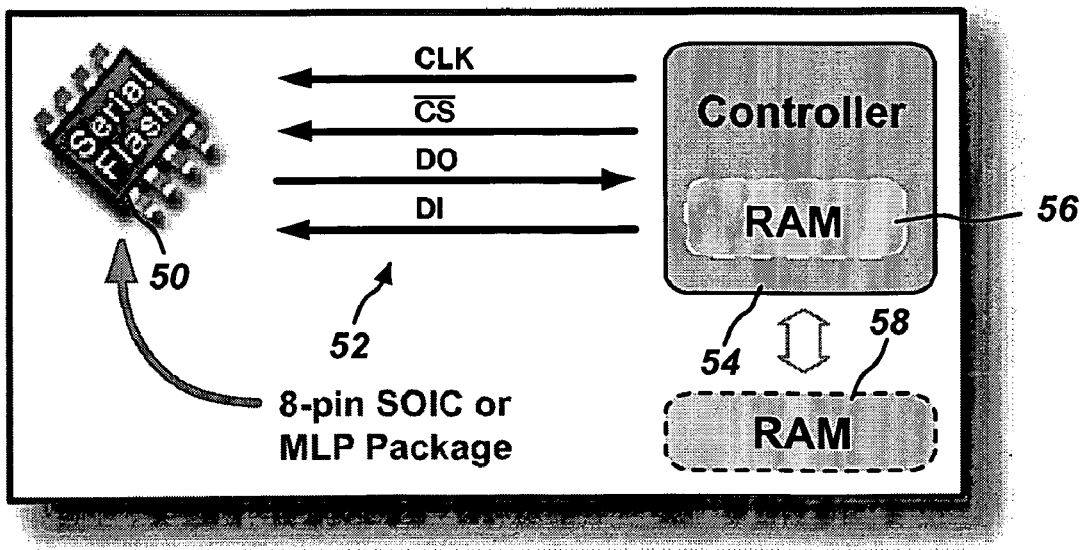
FIG. 5 is a schematic block diagram of a prior art arrangement of an application specific controller using a serial flash memory with a four-pin SPI interface for serial code storage.
Figures 6, 7:
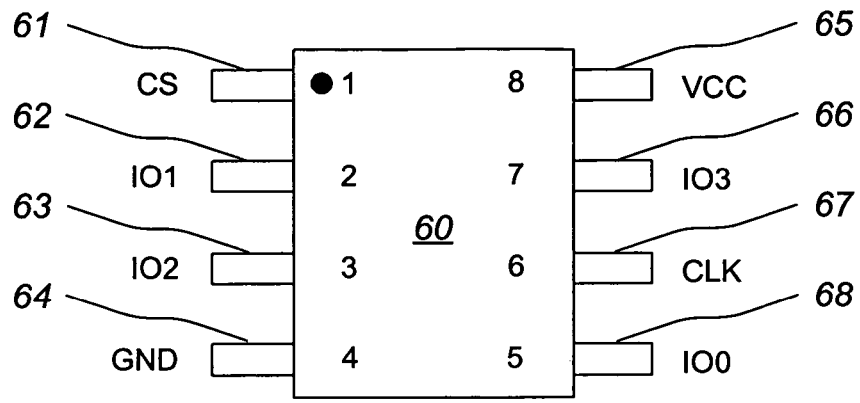
FIG. 6 is a plan diagram of a flash memory package having an example of an Enhanced SPI pinout.
FIG. 7 is a table showing two exemplary pin assignments, one being for a 1 or 4 bit serial flash memory device, and another being for a 1 or 2 bit serial flash memory device.

FIG. 6 shows an illustrative embodiment of an 8-pin SOIC packaged serial flash memory device 60 having four IO pins IO0-3 shown at 68, 62, 63 and 66 respectively, a serial clock input pin CLK shown at 67, a chip select input pin /CS shown at 61, and power supply pins $V_{CC}$ and GND shown at 65 and 64 respectively. While other pin assignments and names may be used if desired, a four pin IO assignment based on the SPI interface is preferred because it achieves the maximum number of data IO pins that can fit into an 8-pin package. The serial flash memory device 60 illustratively is configurable to be compliant with either the SPI protocol or a multiple bit serial protocol based on the SPI protocol, which for convenience is referred to herein as Enhanced SPI ("ESPI") protocol.

FIG. 7 is a table showing two exemplary pin assignments suitable for an 8-pin flash memory. Example A shows how a flash memory may be configured in either the SPI protocol or a four bit ESPI protocol. Example B shows how a flash memory may be configured in either the SPI protocol or a two bit ESPI protocol.

In Example A, the ESPI protocol is a four bit protocol in which the /CS, GND, CLK and $V_{CC}$ pins operate the same as any standard SPI interface, and configurable pins ("CP") 2, 3, 5 and 7 are configured as data IO pins. The SPI protocol is implemented by configuring configurable pins 2 and 5 as DO and DI pins respectively. Optionally, configurable pins 3 and 7 may be configured as /WP and /HOLD pins. If desired, the serial flash memory may also be configurable to be compliant with a single IO data line protocol such as the I2C protocol. The I2C protocol may be implemented by, for example, configuring the configurable pin 2 as a data IO pin. The GND, CLK and $V_{CC}$ pins are operated in accordance with the I2C protocol.

In Example B, the ESPI protocol is a two bit protocol in which the /CS, /WP, GND, CLK, /HOLD and $V_{CC}$ pins operate the same as any standard SPI interface, and configurable pins 2 and 5 are configured as data IO pins. The SPI protocol is implemented by configuring configurable pins 2 and 5 as DO and DI pins respectively. If desired, the serial flash memory device 60 may also be configurable to be compliant with a single IO data line protocol such as the I2C protocol. The I2C protocol may be implemented by, for example, configuring the configurable pin 2 as a data IO pin. The GND, CLK and $V_{CC}$ pins are operated in accordance with the I2C protocol.

FIG. 8 is a table showing a variety of other possible pin assignments for a packaged flash memory device. In each of the examples of FIG. 8, four arbitrary IO pins are listed for purposes of explaining how these pins may be used for various types of data transfer, it being understood that fewer or greater than four pins may be configurable depending on the size of the die or package and the number of concurrent bit transfers desired. Double arrows indicate use as data IO, a right arrow indicates use as a data output, and a left arrow indicates use as a data input.

In Example A, all four pins are IO pins. In ESPI mode, all IO pins are used for data transfer so that four bits may be transferred in either direction at a time. In SPI mode, one IO pin is used as a data output pin, and another IO pin is used as a data input pin. In I2C mode, one of the IO pins is used as a data IO pin.

In Example B, one of the pins is a data output pin and the other three pins are IO pins. In ESPI mode, one of the IO pins is used as a data input pin and the remaining two other pins are used as data IO pins so that three bits may be input using the IO pins and three bits may be output using the DO pin and two of the IO pins. In SPI mode, one IO pin is used as a data input pin. In I2C mode, one of the IO pins is used as a data IO pin.

In Example C, one of the pins is a data input pin and the other three pins are IO pins. In ESPI mode, one of the IO pins is used as a data output pin and the remaining two other pins are used as data IO pins so that three bits may be output using the IO pins and three bits may be input using the DI pin and two of the IO pins. In SPI mode, one IO pin is used as a data output pin. In I2C mode, one of the IO pins is used as a data IO pin.

In Example D of FIG. 8, one pin is a data input pin, one pin is a data output pin, and the other two pins are IO pins. In ESPI mode, the two IO pins are configured as data IO pins so that three bits may be transferred in either direction at a time. In SPI mode, the DO and DI pins are used. In I2C mode, one of the IO pins is used as a data IO pin.

Figure 9:
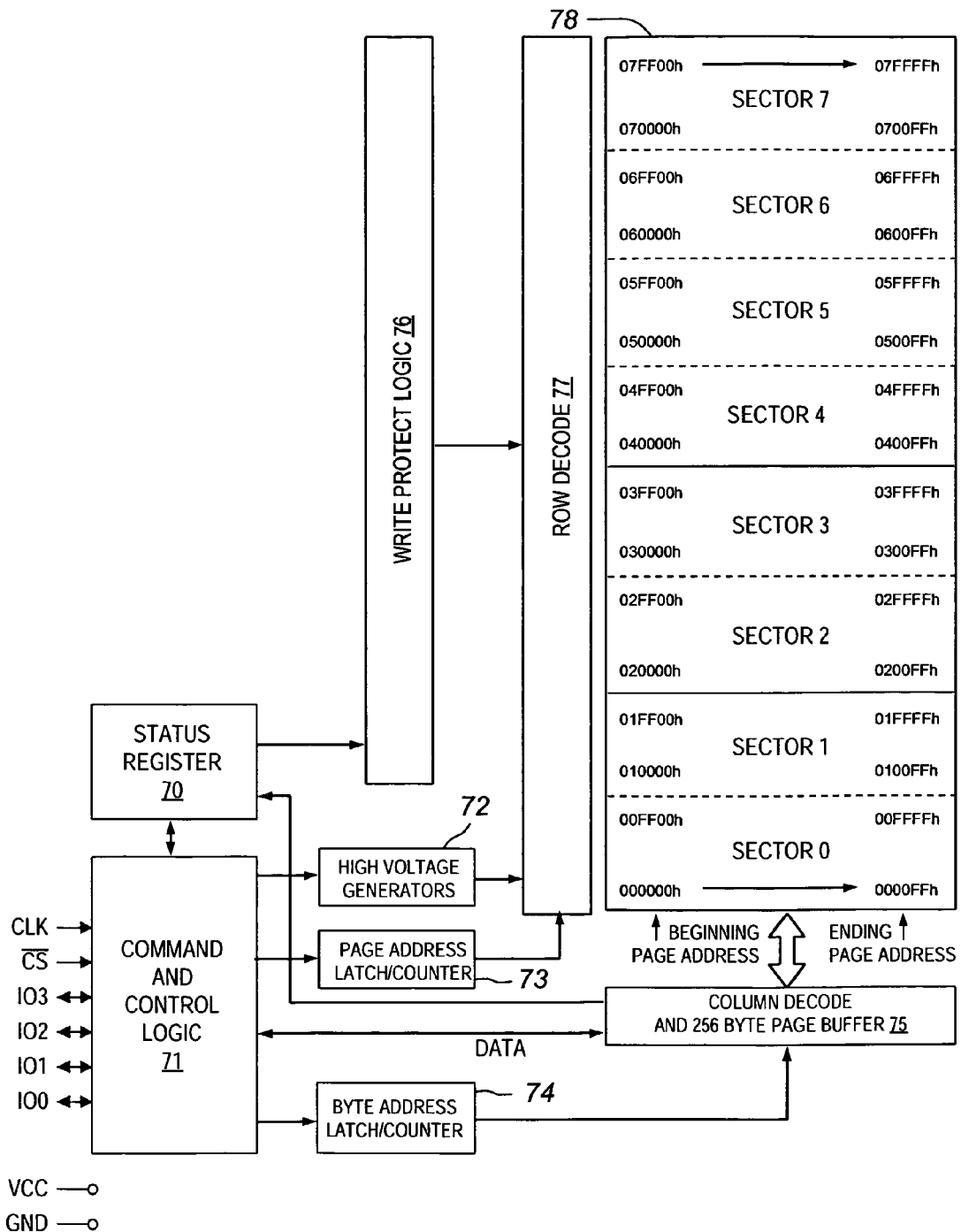
FIG. 9 is a schematic block diagram of an illustrative 4 M-bit serial flash memory device using the pinout of FIG. 6.

A block diagram of an illustrative 4 M-bit serial flash memory device using the pinout of FIG. 6 is shown FIG. 9. A serial flash memory array 78 is divided into eight sectors, each having 65,536 bits. Sector 0 contains bits 000000h through 00FFFFh, sector 1 contains bits 010000h through 01FFFFh, sector 2 contains bits 020000h through 02FFFFh, sector 3 contains bits 030000h through 03FFFFh, sector 4 contains bits 040000h through 04FFFFh, sector 5 contains bits 050000h through 05FFFFh, sector 6 contains bits 060000h through 06FFFFh, and sector 7 contains bits 070000h through 07FFFFh. The serial flash memory array 78 is addressed by row decode circuit 77 and column decode circuit 75, the later containing a 256 byte page buffer. Write protect logic 76 is responsive to the status register 70 to prevent writing to the serial flash memory array 78 under certain circumstances. Command and control logic 71 controls the high voltage generators 72 and page address latch and counter 73, which in turn control the row decode circuit 77. The command and control logic 71 also controls the byte address latch and counter 74, which in turn controls the column decode circuit 75. Power supply pins $V_{CC}$ and GND provide power to all of the circuits of the flash memory device of FIG. 9. The command and control logic 71 also includes four I/O pins IO0-IO3, a serial clock input pin CLK, an a chip select input pin /CS.

Insofar as the enhanced serial flash memory device described herein is provided with multiple IO pins, at least one of which is a configurable data IO pin, two or more bits of information may be controllably received and/or furnished at a time. As a result, such a device may be operated in a standard SPI mode, as well as in a higher performance multiple bit transfer mode, using the same pins. An advantage of this is easy compatibility with third party programming equipment, many of which already support standard SPI Serial Flash memories. Another advantage is that it allows systems to support the standard SPI interface or a multiple bit transfer interface as needed for a given systems data transfer requirements. It also allows for more flexibility in multi-sourcing of serial flash memories.

Illustratively, the enhanced serial flash memory device of FIG. 9 may be accessed in three ways, namely standard SPI, SPI-IN ESPI-OUT, and full ESPI. Standard SPI operation allows data (instructions and associated addresses and data) to be input using a single IO pin (for example, IO0) configured as a data input pin, and also allows status and data to be read (output) using a single IO pin (for example IO1) configured as a data output pin.

SPI-IN ESPI-OUT operation allows data to be input using standard SPI on, for example, pin IO0, and status and data to be read (output) using 4 bit ESPI on pins IO0-IO3. This mode is useful in applications that primarily use serial flash memory for serial code storage in where data is transferred from memory to internal or external RAM upon power-up.

Full ESPI operation allows data to be input and status and data to be read (output) using ESPI on pins IO0-IO3. This mode is useful for applications that frequently access memory or need to execute code directly from the Serial Flash.

While selection of the operating mode may be made in any desired manner, including the use of a separate contact, one particularly advantageous technique is to select the operating mode by means of a status register such as, for example, the status register 70 of FIG. 9. The status register is commonly used for other settings such as write protection. An illustrative status register is shown in FIG. 10, in which bit S0 represents a busy variable BUSY, bit S1 represents the write enable latch variable WEL, bits S4:S2 represent the block protect variable BP2:BP0, bits S6 and S5 represent the operating mode status variables Q1 and Q0, and bit S7 represents the status register protect variable SRP.

The status register settings may be volatile (only valid while power is supplied) or non-volatile (valid even after power is removed), as desired. If the settings are volatile, a serial flash memory supporting ESPI may power-up in standard SPI operation and then be switched to ESPI operation by the firmware. This also allows the controller to query the device to see if it only supports SPI or if it is capable of supporting an ESPI interface. Alternatively if the settings are non-volatile, the ESPI operation can power-up immediately.

The instruction set for an ESPI serial flash memory may be the same as used for a standard SPI serial flash memory such as type NX25P40 available from NexFlash Technologies Inc. of San Jose, Calif. However, when the ESPI operation is used, instructions are transferred four-bits per clock instead of one bit per clock.

An example of Read (03hex) instruction executed in ESPI mode is shown in FIG. 11. The instruction uses only 8 clocks CLK1-CLK8, specifically, two for the instruction type and six for the 24-bit address. This is compared to the 32 clocks required by standard SPI. Additional "dummy" clocks CLK9-CLK16 are shown because they may be needed in some implementations to allow internal addressing to settle before data can be read. However, once data is available, the data transfer rate of the Enhanced SPI operation is about four times that of the standard SPI operation. For example, transferring 64 M-bits of code at 50 MHz takes over 1.3 seconds using standard SPI, which may be a noticeable delay in electronic applications. However, with ESPI the same transfer takes 0.33 seconds.

Additional read instructions with fewer address bits can further minimize the time it takes for accessing data. FIG. 12, for example, shows a Read Block (13hex) instruction that only uses the upper eight bits of a 24-bit address. The entire read instruction with dummy clocks is completed in eight clocks CLK1-CLK8. This Read instruction allows a fast way to access the 64K-byte block of memory.

FIG. 13 shows another example of a Read Page in Current Block (23hex) instruction, which also can be completed in eight clocks CLK1-CLK8. This Read instruction allows a fast way to access one of 256 pages with in the most recently addressed block.

The significant reduction in instruction overhead realized with multiple bit serial transfers for many instructions, and especially for the short instructions like those described above, enables custom controllers to receive code directly from the ESPI interface into an internal instruction register or an internal cache, from which the code may be decoded an execute nearly contemporaneously with the transfer thereof from the flash serial memory device. Alternatively, instructions may be decoded in segments as the segments are received so that execution of instructions may proceed even more rapidly. With careful design, controllers may fetch and execute instructions using the ESPI protocol and eliminate external parallel flash and/or RAM, thereby resulting in significant cost saving from a reduction in controller pins and system memory components.

Figure 14:
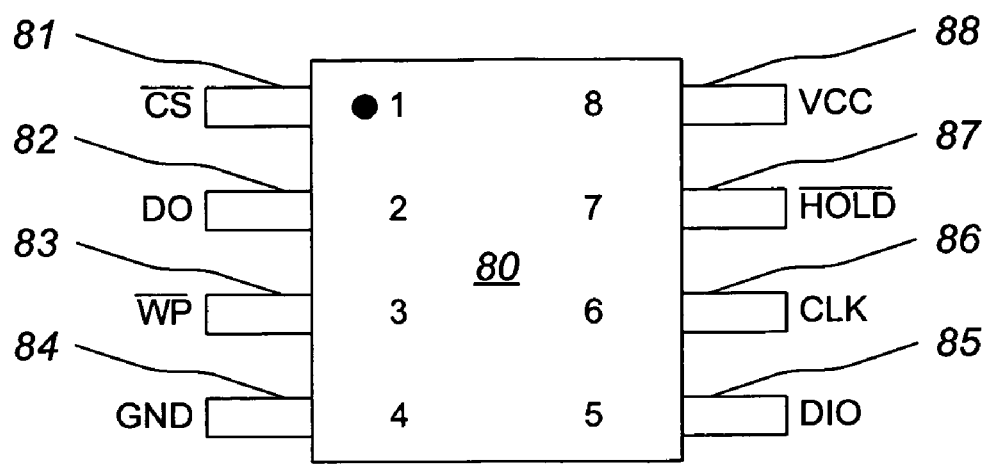
FIG. 14 is a plan diagram of a flash memory package having another example of an Enhanced SPI pinout.
Figure 15:
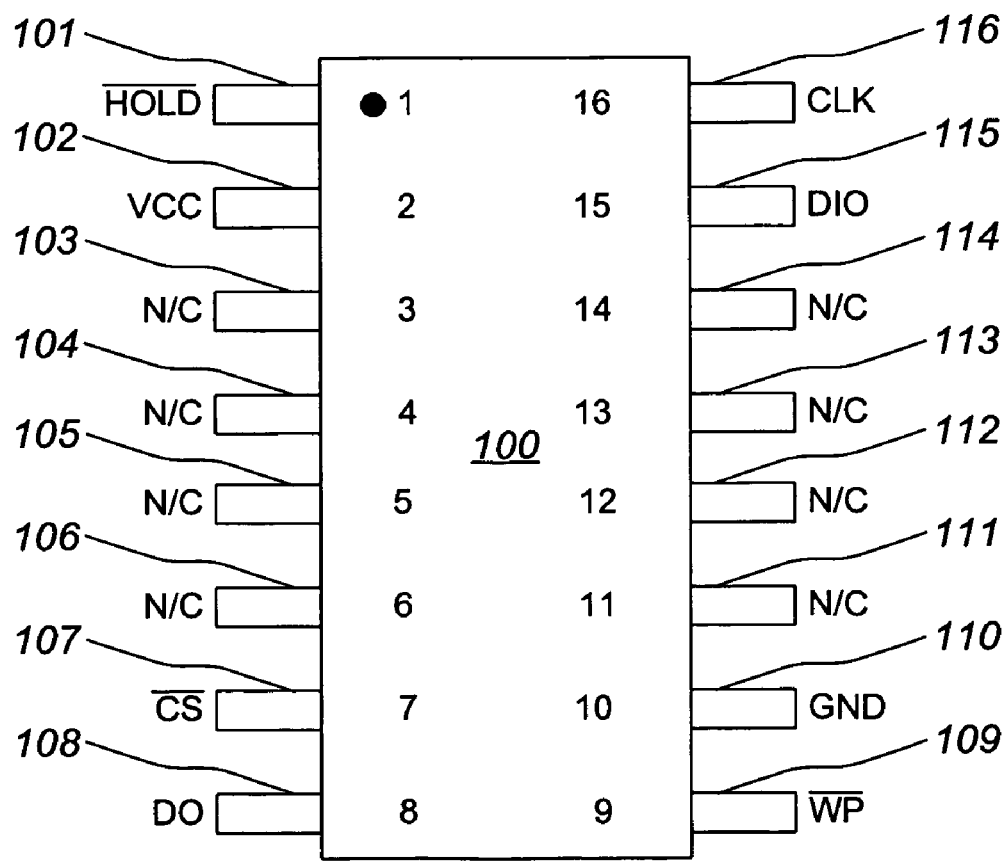
FIG. 15 is a plan diagram of a flash memory package having another example of an Enhanced SPI pinout.

A preferred implementation of a serial flash memory with multiple configurable pins to achieve significant performance improvement with minimal command and control logic complexity uses the SPI protocol for data input, and either the standard SPI protocol or the two bit ESPI protocol for data output. FIG. 14 and FIG. 15 show illustrative serial flash memory devices 80 and 100, both of which are configurable in this manner. The device 80 shown in FIG. 14 is an 8-pin SOIC packaged serial flash memory device which has a configurable data output pin DO shown at 82, a configurable data input/output pin DIO shown at 85, a serial clock input pin CLK shown at 86, a chip select input pin /CS shown at 81, a write protect input /WP shown at 83, a hold input /HOLD shown at 87, and power supply pins VCC and GND shown at 88 and 84 respectively. The device 100 shown in FIG. 15 is a 16-pin SOIC packaged serial flash memory device which has a configurable data output pin DO shown at 108, a configurable data input/output pin DIO shown at 115, a serial clock input pin CLK shown at 116, a chip select input pin /CS shown at 107, a write protect input /WP shown at 109, a hold input /HOLD shown at 101, and power supply pins VCC and GND shown at 102 and 110 respectively. The pins 103, 104, 105, 106, 111, 112, 113 and 114 are designated "no connection."

FIG. 16 is a table showing an illustrative pin assignment suitable for the 8-pin flash memory device 80. A similar pin assignment is suitable for the 16-pin flash memory device 100. Pins 2 and 5 are configurable pins. In SPI mode, which is used for input and which may be used for output, pin 2 is configured for bit-serial output and pin 5 is configured for bit-serial input. In ESPI mode, which may be used for output, pin 2 is configured to output odd data bits 7, 5, 3 and 1, and pin 5 is configured to output even data bits 6, 4, 2 and 0. This mode is particularly effective for applications that use the serial flash memory device for boot code, or code shadowing, in which the contents of the serial flash memory device is downloaded into faster RAM memory upon power-up or before execution. The /CS, /WP, GND, CLK, /HOLD and VCC pins function the same under both the SPI protocol and the ESPI protocol.

FIG. 17 is a table showing an illustrative set of instructions suitable for the 8-pin flash memory device 80 and for the 16-pin flash memory device 100. Particularly instructive are the "Fast Read" instruction 0Bh, and the "Fast Read Dual Output" instruction 3Bh. While selection of the operating mode may be made in any desired manner, a particular advantageous technique when only one or just a few instructions operate in compliance with the ESPI protocol is for the instruction itself to initiate and terminate the mode. In the instance of the illustrative instruction set of FIG. 17, all instructions except the "Fast Read Dual Output" instruction 3Bh operate in compliance with the SPI protocol, so that the flash memory device enters into the ESPI mode in response to the "Fast Read Dual Output" instruction 3Bh and returns to SPI mode operation when execution of the "Fast Read Dual Output" instruction 3Bh is completed.

Figure 18:
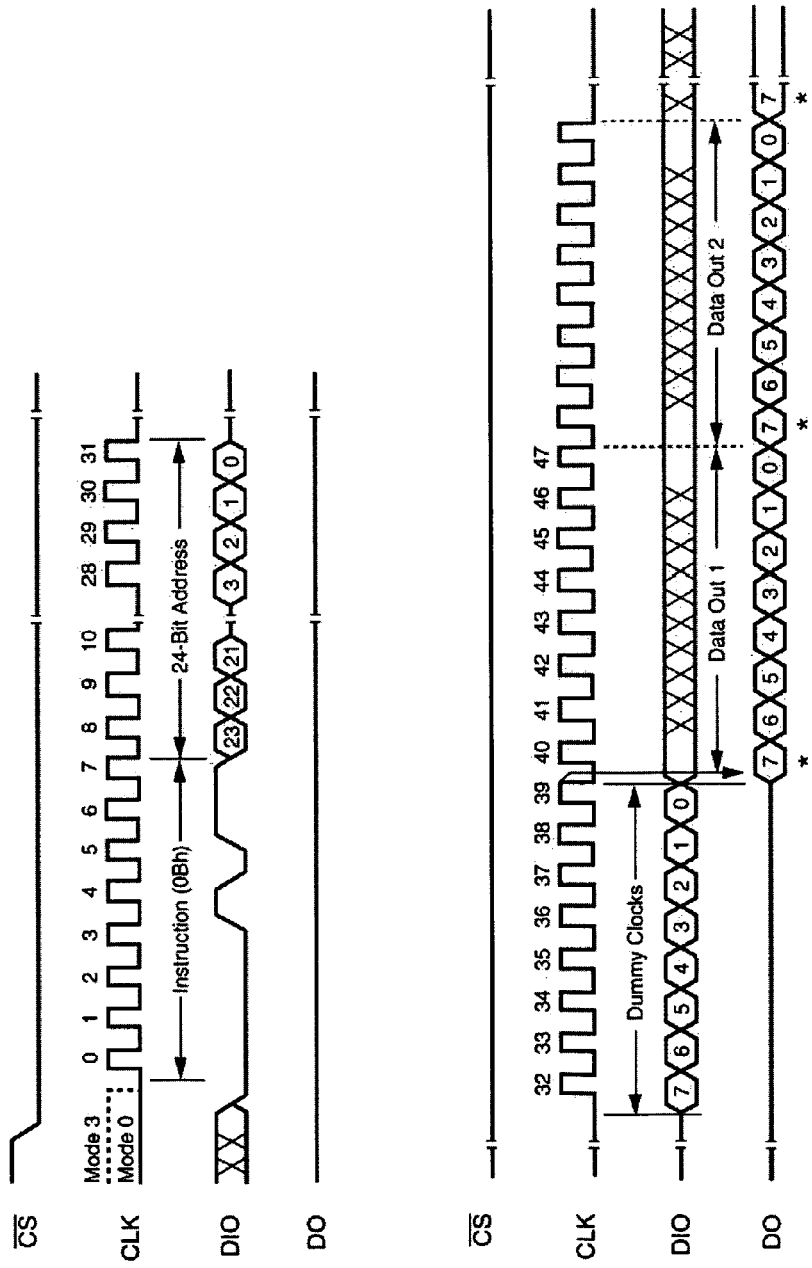
FIG. 18 is an instruction sequence diagram for a "Fast Read" instruction.

FIG. 18 is an instruction sequence diagram for the "Fast Read" instruction 0Bh, which operates under the SPI protocol to allow one or more data bytes to be sequentially read from the memory at the highest possible frequency. The instruction is initiated by driving the /CS pin low and then shifting the instruction code "0Bh" followed by a 24-bit address (A23-A0) into the DIO pin 5 (FIG. 14). A number of dummy clocks (eight are shown) may be added after the 24-bit address if internal circuits of the flash memory device require additional time for setting up the initial address. At the end of the string of dummy clocks, the data byte of the addressed memory location is shifted out on the DO pin 2 (FIG. 14) at the falling edge of CLK with the most significant bit first. The address is automatically incremented to the next higher address after each byte of data is shifted out. The instruction is completed by driving /CS high.

Figure 19:
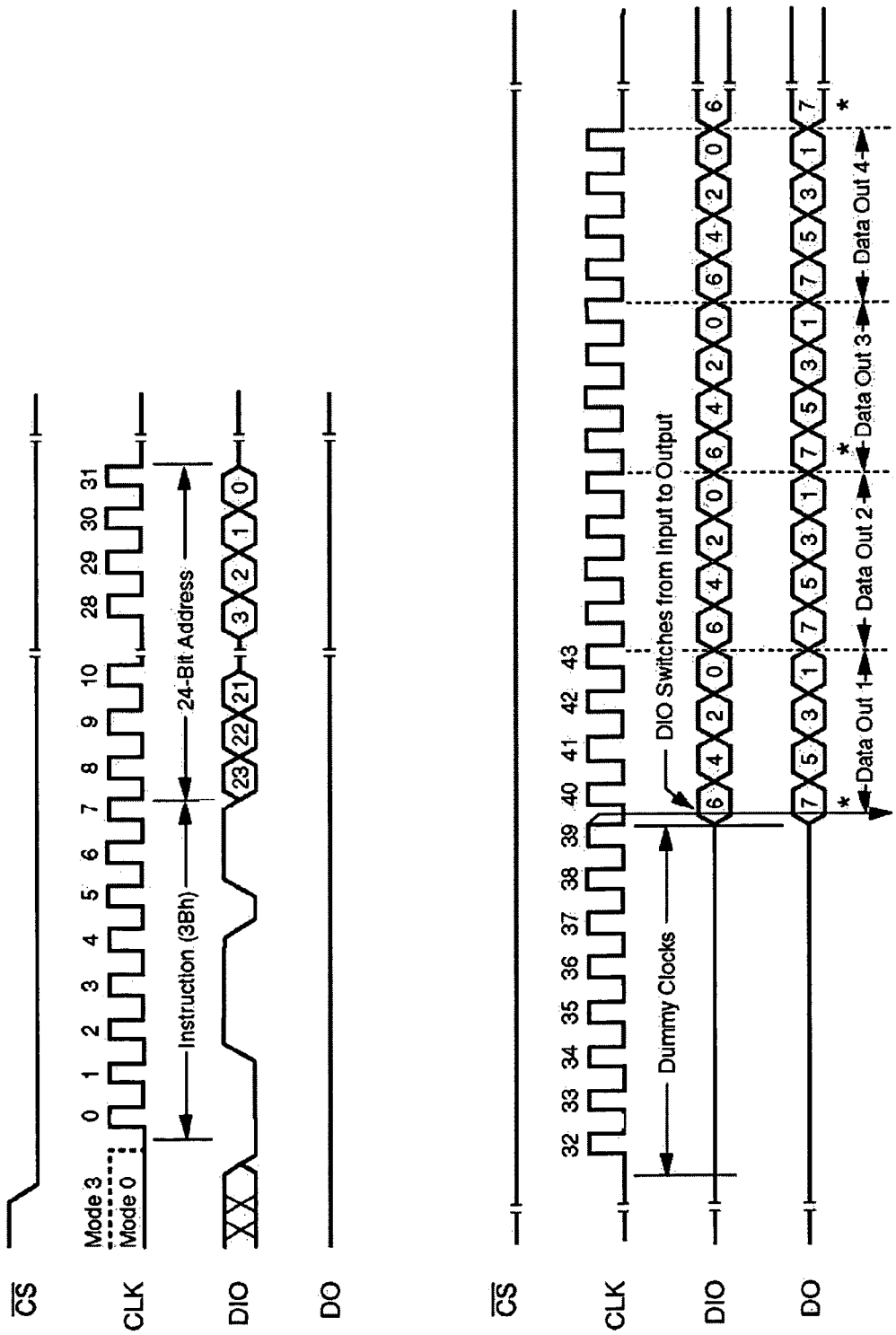
FIG. 19 is an instruction sequence diagram for a "Fast Read Dual Output" instruction.

FIG. 19 is an instruction sequence diagram for the "Fast Read Dual Output" instruction 3Bh, which operates under the ESPI protocol to allow one or more data bytes to be sequentially read from the memory at the highest possible frequency, but at effectively twice the rate as the "Fast Read" instruction because two pins are used to output alternate bits. The instruction is initiated by driving the /CS pin low and then shifting the instruction code "3Bh" followed by a 24-bit address (A23-A0) into the DIO pin 5 (FIG. 14). A number of dummy clocks (eight are shown) may be added after the 24-bit address if internal circuits of the flash memory device require additional time for setting up the initial address. At the end of the string of dummy clocks, the DIO pin 5 switches from an input pin to an output pin, and the data byte of the addressed memory location is shifted out at the falling edge of CLK with the most significant bit first. The shifting out of the bits of the addressed memory location alternate between the DO pin 2 (FIG. 14) and the DIO pin 5 configured as an output pin. While odd bits are shown on the DO pin 2 and even bits are shown on the DIO pin 5, this arrangement may be reversed if desired. The address is automatically incremented to the next higher address after each byte of data is shifted out. The instruction is completed by driving /CS high.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. A flash memory comprising:
    a flash memory array; and
    an interface circuit coupled to the flash memory array, the interface circuit having a plurality of pins and being selectively compliant with a single-bit serial protocol and a multiple-bit serial protocol;
    wherein a first one of the pins is configurable with the interface circuit for single-bit serial transfer in compliance with the single-bit serial protocol; and
    wherein the first pin and a second one of the pins are configurable with the interface circuit for multiple-bit serial transfer that is addressable but unassociated with dedicated address pins in compliance with the multiple-bit serial protocol.

2. The flash memory of claim 1 wherein the single-bit serial protocol is Inter IC protocol.

3. The flash memory of claim 1 wherein the single-bit serial protocol is Serial Peripheral Interface protocol.

4. The flash memory of claim 1 wherein the multiple-bit serial protocol specifies concurrent transfer of two bits.

5. The flash memory of claim 1 wherein:
    a third one of the pins and a fourth one of the pins are configurable for multiple-bit serial transfer that is addressable but unassociated with dedicated address pins in compliance with the multiple-bit serial protocol; and
    the multiple bit serial protocol specifies concurrent transfer of four bits.

6. The flash memory of claim 1 wherein the first and second pins are input/output pins.

7. The flash memory of claim 1 wherein:
the second pin is a data output pin; and
the first pin is an input/output pin.

8. The flash memory of claim 1 wherein:
the first pin is an input/output pin; and
the second pin is a data input pin.

9. The flash memory of claim 1 wherein:
the first pin is selectively configurable with the interface circuit as an input in compliance with the single bit serial protocol and as an input that is addressable but unassociated with dedicated address pins in compliance with the multiple bit serial protocol;
the second pin is selectively configurable with the interface circuit as a data output in compliance with the single bit serial protocol and as a data output that is addressable but unassociated with dedicated address pins in compliance with the multiple bit serial protocol; and
wherein a third one of the pins is an input/output that is addressable but unassociated with dedicated address pins in compliance with the multiple bit serial protocol.

10. The flash memory of claim 9 wherein the single-bit serial protocol is Serial Peripheral Interface.

11. The flash memory of claim 9 wherein the multiple bit serial protocol specifies concurrent transfer of two bits.

12. The flash memory device of claim 9 wherein:
a fourth one of the pins and a fifth one of the pins are inputs/outputs that are addressable but unassociated with dedicated address pins in compliance with the multiple bit serial protocol; and
the multiple bit serial protocol specifies concurrent transfer of four bits.

13. The flash memory of claim 1 wherein:
the first pin is selectively configurable with the interface circuit as an input/output in compliance with the single bit serial protocol and as an input/output that is addressable but unassociated with dedicated address pins in compliance with the multiple bit serial protocol; and
the second pin is an input/output that is addressable but unassociated with dedicated address pins in compliance with the multiple bit serial protocol.

14. The flash memory device of claim 13 wherein the single-bit serial protocol is Inter IC.

15. The flash memory of claim 13 wherein the multiple bit serial protocol specifies concurrent transfer of two bits.

16. The flash memory of claim 13 wherein:
a third one of the pins and a fourth one of the pins are inputs/outputs that are addressable but unassociated with dedicated address pins in compliance with the multiple bit serial protocol; and
the multiple bit serial protocol specifies concurrent transfer of four bits.

17. A flash memory comprising:
a flash memory array; and
an interface circuit coupled to the flash memory array, the interface circuit having a plurality of pins and being selectively compliant with a single-bit serial protocol and a multiple-bit serial protocol;
wherein a first one of the pins is configurable with the interface circuit as a data output pin in compliance with the single-bit serial protocol during an output sequence of a "Fast Read" instruction;
wherein the first pin and a second one of the pins are configurable with the interface circuit as data output pins in compliance with the multiple-bit serial protocol during an output sequence of a "Fast Read Dual Output" instruction; and
wherein the second pin is configurable with the interface circuit as a data input pin in compliance with the single-bit serial protocol during respective input sequences of the "Fast Read" instruction and the "Fast Read Dual Output" instruction.

18. A flash memory comprising:
a flash memory array; and
an interface circuit coupled to the flash memory array, the interface circuit having a clock pin, a chip select pin, and first, second, third and fourth pins, and being selectively compliant with Serial Peripheral Interface protocol and a four-bit serial protocol;
wherein the first pin is configurable with the interface circuit as a data output pin and the second pin is configurable with the interface circuit as an input pin for single-bit serial transfer in compliance with the Serial Peripheral Interface protocol; and
wherein the first, second, third and fourth pins are further configurable with the interface circuit as input/output pins for four-bit serial transfers that are addressable but unassociated with dedicated address pins in compliance with the four-bit serial protocol.

19. The flash memory of claim 18 wherein:
the third pin is further configurable with the interface circuit as a write protect pin in compliance with the Serial Peripheral Interface protocol; and
the fourth pin is further configurable with the interface circuit as a hold pin in compliance with the Serial Peripheral Interface protocol.

20. A flash memory comprising:
a flash memory array; and
an interface circuit coupled to the flash memory array, the interface circuit having a plurality of pins and being selectively compliant with a single-bit serial protocol and a multiple-bit serial protocol;
wherein a first one of the pins is selectively configurable with the interface circuit as an input in compliance with the single bit serial protocol and as an input/output that is addressable but unassociated with dedicated address pins in compliance with the multiple bit serial protocol; and
wherein a second one of the pins is selectively configurable with the interface circuit as a data output in compliance with the single bit serial protocol and as an input/output that is addressable but unassociated with dedicated address pins in compliance with the multiple bit serial protocol.

21. The flash memory of claim 20 wherein the single-bit serial protocol is Serial Peripheral Interface.

22. The flash memory of claim 20 wherein the multiple bit serial protocol specifies concurrent transfer of two bits.

23. The flash memory of claim 20 wherein:
a third one of the pins and a fourth one of the pins are inputs/outputs that are addressable but unassociated with dedicated address pins in compliance with the multiple bit serial protocol; and
the multiple bit serial protocol specifies concurrent transfer of four bits.

24. A flash memory comprising:
a flash memory array; and
an interface circuit coupled to the flash memory array, the interface circuit having a plurality of pins and being selectively compliant with a single-bit serial protocol and a multiple-bit serial protocol;

wherein a first one of the pins is configurable with the interface circuit for single-bit serial input in compliance with the single-bit serial protocol;

wherein a second one of the pins is configurable with the interface circuit for single-bit serial data output in compliance with the single-bit serial protocol; and wherein the first pin and the second pin are configurable with the interface circuit for multiple-bit serial output that is addressable but unassociated with dedicated address pins in compliance with the multiple-bit serial protocol.

25. A packaged flash memory device comprising:

an only eight-contact SOIC or MLP package body;

a flash memory array contained in the package body;

an interface circuit contained in the package body and coupled to the flash memory array, the interface circuit being selectively compliant with a Serial Peripheral Interface protocol and an Enhanced Serial Peripheral Interface protocol; and four or fewer data contacts, a clock contact, and a chip select contact mounted on the package body and coupled to the interface circuit, a first one of the data contacts being selectively configurable with the interface circuit as an input in compliance with the Serial Peripheral Interface protocol and as an input/output that is addressable but unassociated with dedicated address pins in compliance with the Enhanced Serial Peripheral Interface protocol, and a second one of the data contacts being selectively configurable with the interface circuit as a data output in compliance with the Serial Peripheral Interface protocol and as an input/output that is addressable but unassociated with dedicated address pins in compliance with the Enhanced Serial Peripheral Interface protocol.

26. A packaged flash memory device operable under either a single-bit serial protocol or a multiple-bit serial protocol, comprising:

an only eight-contact SOIC or MLP package body;

first and second data contacts, a clock contact, and a chip select contact mounted on the package body;

a flash memory array contained in the package body; and an interface circuit contained in the package body and coupled to the flash memory array and to the first and second data contacts, a clock contact, and a chip select contact, the interface circuit being operable under a single-bit serial protocol to establish the first data contact as an input and the second data contact as a data output, and operable under a multiple-bit serial protocol to establish the first and second data contacts as inputs/outputs that are addressable but unassociated with dedicated address pins.

27. The flash memory of claim 26 further comprising a write protect contact and a hold contact mounted on the package body and coupled to the interface circuit.

28. The flash memory of claim 26 further comprising third and fourth data contacts coupled to the interface circuit, the interface circuit being operable under the multiple-bit serial protocol to establish the third and fourth data contacts as inputs/outputs that are addressable but unassociated with dedicated address pins.

29. A packaged flash memory device operable under either a single-bit serial protocol or a multiple-bit serial protocol, comprising:

an SOIC or MLP package body;

a flash memory array contained in the package body;

an interface circuit contained in the package body and coupled to the flash memory;

a clock contact coupled to the interface circuit;

a chip select contact coupled to the interface circuit; and first and second data contacts coupled to the interface circuit, the interface circuit being operable under a single-bit serial protocol to establish the first data contact as an input and the second data contact as a data output, and operable under a multiple-bit serial protocol to establish the first and second data contacts as data outputs that are addressable but unassociated with dedicated address pins.

* * * * *

UNITED STATES PATENT AND TRADEMARK OFFICE
CERTIFICATE OF CORRECTION

| | | |
|---|---|---|
| PATENT NO. | : 7,558,900 B2 | Page 1 of 1 |
| APPLICATION NO. | : 11/078205 | |
| DATED | : July 7, 2009 | |
| INVENTOR(S) | : Robin J. Jigour et al. | |

It is certified that error appears in the above-identified patent and that said Letters Patent is hereby corrected as shown below:

Title page, Item (73), the assignee name "Winbound Electronics Corporation" should read --Winbond Electronics Corporation--.

Signed and Sealed this

Twenty-fifth Day of August, 2009

David J. Kappos
*Director of the United States Patent and Trademark Office*